United States Patent [19]
Beranger et al.

[11] Patent Number: 5,245,280
[45] Date of Patent: Sep. 14, 1993

[54] MAGNETIC RESONANCE MAGNETOMETER WITH MULTIPLEXED EXCITING WINDINGS

[75] Inventors: Marc Beranger, Meylan; Nelly Kernevez, Grenoble; Jean-Michel Leger, Meylan; Frédéric Stoeckel, Uriage, all of France

[73] Assignee: Commissariat a l'Energie Atomique, Paris, France

[21] Appl. No.: 712,409

[22] Filed: Jun. 10, 1991

[30] Foreign Application Priority Data

Jun. 14, 1990 [FR] France .................. 90 07412

[51] Int. Cl.⁵ .................................. G01V 3/00
[52] U.S. Cl. ............................. 324/302; 324/304
[58] Field of Search ............ 324/300, 302, 304, 305, 324/318, 322

[56] References Cited

U.S. PATENT DOCUMENTS

| | | | |
|---|---|---|---|
| 3,103,621 | 9/1963 | Fraser | 324/304 |
| 3,284,699 | 11/1966 | Malnar | 324/304 |
| 3,443,208 | 5/1969 | Ruddock et al. | 324/304 |
| 4,814,707 | 3/1989 | Marton | 324/304 |

FOREIGN PATENT DOCUMENTS 964027  7/1964  United Kingdom .

OTHER PUBLICATIONS

IEEE Transactions on Geoscience Electronics, vol. GE-16, No. 3, 1978, pp. 195-198, IEEE, New York, US; A.M.A. Frandsen et al.: "The ISEE-C", p. 195, ligne 18-p. 196, ligne 2; pp. 196-197, chapter: Instrument description, Sensor, Electronics, Operating principles; FIG. 2.

Primary Examiner—Louis Arana
Attorney, Agent, or Firm—Oblon, Spivak, McClelland, Maier & Neustadt

[57] ABSTRACT

A magnetometer having three trirectangular trihedron windings (20x, 20y, 20z) which are put into service successively by a multiplexer (50). The means frequency ($F_m$) of the three measurement signals is independent of the orientation of the weak magnetic field which is to be measured.

12 Claims, 7 Drawing Sheets

MAGNETIC RESONANCE MAGNETOMETER WITH MULTIPLEXED EXCITING WINDINGS

BACKGROUND OF THE INVENTION

1. Field of Invention

The present invention relates to a magnetometer. it is used in the precise measurement of weak magnetic fields (typically in the range 20 to 70 μT corresponding to the values of the earth's magnetic field).

2. Discussion of Background

The magnetometer according to the invention concerns a so-called resonance magnetometer type, a description of such a type is given in the article by F. HARTMAN entitled "Resonance Magnetometers", published in the journal "IEEE Transactions on Magnetics", vol. MAG-8, No. 1, March 1972, pp. 66–75.

A resonance magnetometer is an apparatus which, immersed in a magnetic field Bo, supplies an electric signal of frequency F, whose value is linked with Bo by the so-called LARMOR relation:

$$F = \gamma Bo$$

where $\gamma$ is a gyromagnetic ratio (of an electron or nucleon as a function of the substance used). For example, for the electron this ratio is equal to 28 Hz/nT.

The excitation of the magnetic resonance is obtained by a winding positioned around the substance used and the sampling of a resonance signal takes place either by another winding (electrical variant) or by a pumping light beam (optical variant).

Although the invention is applicable to all magnetic resonance magnetometers, the optical pumping magnetometer will more particularly be considered hereinafter, but without in any way restricting the scope of the invention.

An optical pumping magnetometer is diagrammatically shown in FIG. 1. An at least partly transparent cell 10 is filled with a gas 12, which is generally helium, at a pressure of 1 to a few Torr. A light source 14 supplies a light beam 18, whose wavelength is approximately 1.1 μm. This beam is appropriately polarized by a means 16 and is then injected into the cell 10.

In addition, a radio frequency or high frequency discharge of a so-called weak or gentle type is produced in the gas by a generator 30 connected to two electrodes 32,33 arranged around the cell 10. This discaharge produces atoms in a metastable state ($2^3S_1$ in the case of helium). The incident light beam "pumps" these atoms from the metastable state to bring them into another excited state ($2^3P$).

In the presence of a magnetic field Bo, the energy levels are subdivided into so-called ZEEMAN sublevels. A resonance between such sublevels can be established by a high frequency field (magnetic resonance) or by light modulation (double optical resonance; COHEN, TANNOUDJI, Ann. Phys. 7, 1962, p. 423). In the case of isotopic helium 4, the resonance is established between two ZEEMAN electronic sublevels of the metastable state.

This resonance is revealed by various known means, whereof one variant is shown in FIG. 1. It is a winding 20 located on either side of the cell 10 (in a so-called HELMHOLTZ arrangement) of a high frequency generator 22, a photodetector 24 receiving the light radiation which has traversed the cell, an amplifier 25, a synchronous detection means 21 and an integrator 23.

The means 21 to 26 will be designated CC hereinafter. The generator 22 supplies the winding 20 with current at frequency F, which creates an oscillating magnetic field, whereof one component maintains the resonance and on its return modulates the light frequency which is passed through the cell, said modulation constituting the signal. It is revealed by the synchronous detection at the output of the photodetector, via the amplifier. The reference is given by the generator. The synchronous detection output corresponding to the component of the signal is in phase with the reference serves as an error signal. The static error is eliminated therefrom by the integrator. This error signal readjusts the frequency F of the synthesizer to the LARMOR frequency. For this purpose it is necessary for the synthesizer to be voltage-controllable and it can also be replaced by a voltage-controlled oscillator (V.C.O).

An electric resonance signal S is consequently established in this loop at the LARMOR frequency. A frequency meter 26 gives the value F thereof. The field to be measured Bo is deduced therefrom by the relation $Bo = F/\gamma$.

Helium magnetometers of this type have firstly made use of helium lamps. The recent arrival of lanthanum-neodymium aluminate (or LNA) crystals have made it possible to produce lasers tunable about the wavelength of 1.083 μm precisely corresponding to the optical pumpling line of helium. Naturally this type of laser has taken the place of these lamps with a significant performance improvement, so that once again interest have been aroused in such magnetometers. Such a magnetometer equipped with a LNA laser is described in FR-A-2 598 518.

Although satisfactory in certain respects, these magnetometers still suffer from disadvantages. The most important disadvantage is the existance of a frequency shift due to the so-called BLOCH-SIEGERT effect caused by one of the components of the high frequency exciting field. This phenomenon is illustrated in FIG. 2, which shows the respective orientations of the magnetic fields used.

Ideally, the radio frequency or high frequency field B1 should be perpendicular to the field Bo to be measured. In practise, these two fields form an angle between them of $\theta$. The component of B1 projected onto a plane perpendicular to Bo consequently has for the amplitude B1 sin $\theta$. The amplitude of the resonance signal is consequently dependant on the angle between the field to be measured and the high frequency field, the magnetometer not being isotropic in amplitude.

The alternating field B1 sin $\theta$ can be considered as the result of the composition of two circular components b+1 and b−1 rotating in opposite directions. Only one of these components (b+1 in FIG. 2) rotates in the precession direction of the spins Sp and is able to maintain the precession about the field Bo. The other component b−1 does not directly participate in the resonance phenomenon, but induces a frequency shift of value:

$$\Delta F = -\frac{\gamma B1^2}{4Bo} \sin^2 \theta$$

This is the BLOCH-SIEGERT effect described in the journal "Physical Review", 57, 1940, p.522.

When the orientation of the cell (with its winding) varies, the angle $\theta$ varies and the frequency shift changes and the magnetometer is not isotropic in frequency.

In order to illustrate the extent of this phenomenon, it is possible to consider the case of a helium 4 magnetometer (for which the resonance is electronic, the nucleus of such isotope being spin-free.) located in a diameter 6 cm sphere. the high frequency field B1 is created by two 4.5 cm diameter coils in the HELMHOLTZ position and 2.25 cm apart. They are constituted by three 0.5 mm diameter, copper wire turns. When they are traversed by a 10 mA current, the field at the centre of the cell is 600 nT. In our latitudes, the earth's magnetic field Bo is 70 μT.

If $\theta=0°$, the high frequency field B1 is parallel to the field Bo and there is no resonance signal. If $\theta=90°$, the high frequency field B1 is perpendicular to the field Bo, the resonance signal is at a maximum, but so is the BLOCH-SIEGERT effect. The frequency shift is 55 Hz, i.e. an error on the field Bo to be measured of 2 nT (approx. $3.10^{-5}$). If $\theta=45°$, the resonance signal is only 70% of its maximum value and the frequency shift is 40 Hz, i.e. an error on the field to be measured of 1.4 nT.

This frequency anisotropy can be corrected by compensation formulas, if it is possible to determine the direction of the static field Bo relatively to the sensor using appropriate means (e.g. a directional magnetometer). However, this solution is costly and difficult to put into effect, because all instrumentation must be amagnetic and rigidly linked with the cell.

SUMMARY OF THE INVENTION

The present invention specifically aims at obviating these disadvantages. Therefore the invention proposes a resonance magnetometer, which is isotropic in frequency, i.e. free from any error linked with the BLOCH-SIEGERT effect, and which remains simple and lightweight.

According to the invention, this objective is achieved by the use of three exciting windings (instead of one), whose axes are directed in accordance with three orthogonal directions (in other words, whose axes form a trirectangular trihedron). These windings are multiplexed i.e. are successively switched on.

This apparent complexity leads to the following essential advantage. Each winding gives rise to a resonance signal specific thereto and having a frequency Fi (in which i is an index used for x, y or z on designating the axes of the three windings by the standard notations Oxyz). This frequency Fi generally suffers from an error ΔFi, as a function of the orientation of the winding with respect to Bo in the manner described hereinbefore (except if one of the axes of the windings is strictly perpendicular to Bo): $Fi=\gamma Bo+\Delta Fi$.

The invention makes use of the property according to which the sum of the errors $\Delta Fx+\Delta Fy+\Delta Fz$ on the three frequencies Fx, Fy and Fz is independent of the direction of the field Bo. This sum is given by the quantity:

$$\sum_i Fi = -\frac{\gamma B1^2}{2Bo}$$

Thus, taking the mean of the three frequencies, i.e. $\frac{1}{3}(Fx+Fy+Fz)$, we obtain a quantity which is independent of the orientation of Bo, so that the magnetometer is isotropic in frequency.

Thus, the invention specifically relates to a magnetometer having the known means described hereinbefore and which is characterized in that the exciting winding comprises three windings having axes forming a trirectangular trihedron Ox, Oy, Oz, the magnetometer also having a multiplexer able to sequentially connect each of the three windings to the exciting circuit and means for measuring the mean Fm of the three frequencies Fx, Fy and Fz of the three resonance signals, corresponding to the three windings, the value of the ambient magnetic field Bo then being given by $Bo=Fm/\gamma$.

According to a special embodiment, the means able to maesure the mean frequency Fm also measure the three frequencies Fx, Fy and Fz, which makes it possible to obtain information on the direction of the field to be measured Bo. The magnetometer is then no longer solely scalar i.e. giving the modulus of the field), but is also vectorial, (i.e. giving the components of the field on the three axes of the windings).

According to other embodiments, the measuring means give the mean amplitude Am of the three resonance signals, whose value is never 0, no matter what the orientation of the field, which reduces the amplitude anisotropy. These means can also give the three amplitudes relative to the three windings, which also provides information on the orientation of the field to be measured in the trihedron formed by the windings.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 3:
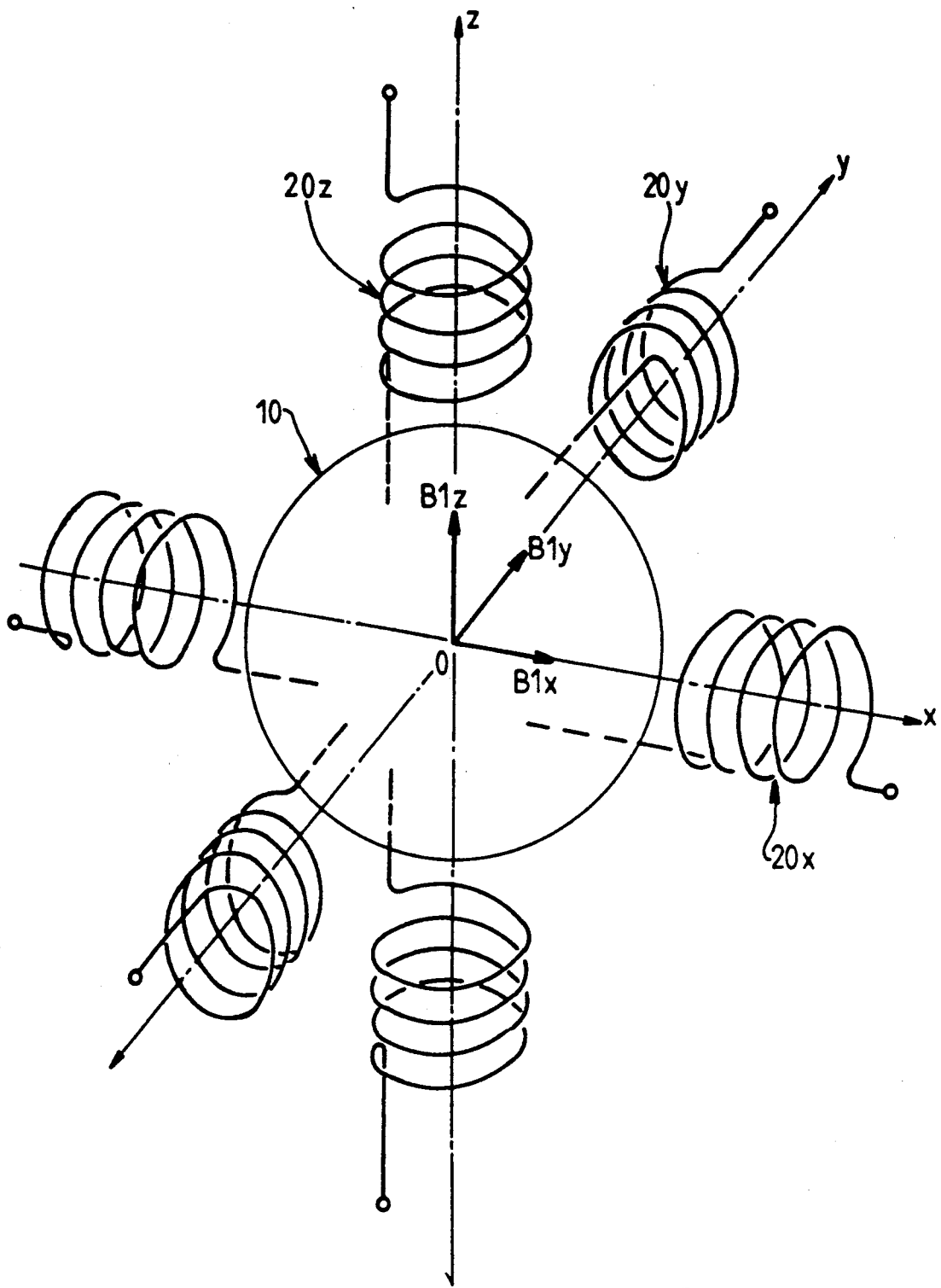
FIG. 3 the arrangement of the three multiplexed exciting coils according to the invention.

The apparatus shown in FIG. 3 has three windings 20x, 20y and 20z used in accordance with the invention. They are shown in a HELMHOLTZ arrangement, i.e. formed by two half-windings wound on either side of the cell 10. The axis of these windings constitute a trirectangular trihedron Ox, Oy and Oz. When traversed by a current, these windings create three oscillating fields B1x, B1y and B1z, which are orthogonal in pairs.

Figure 1:
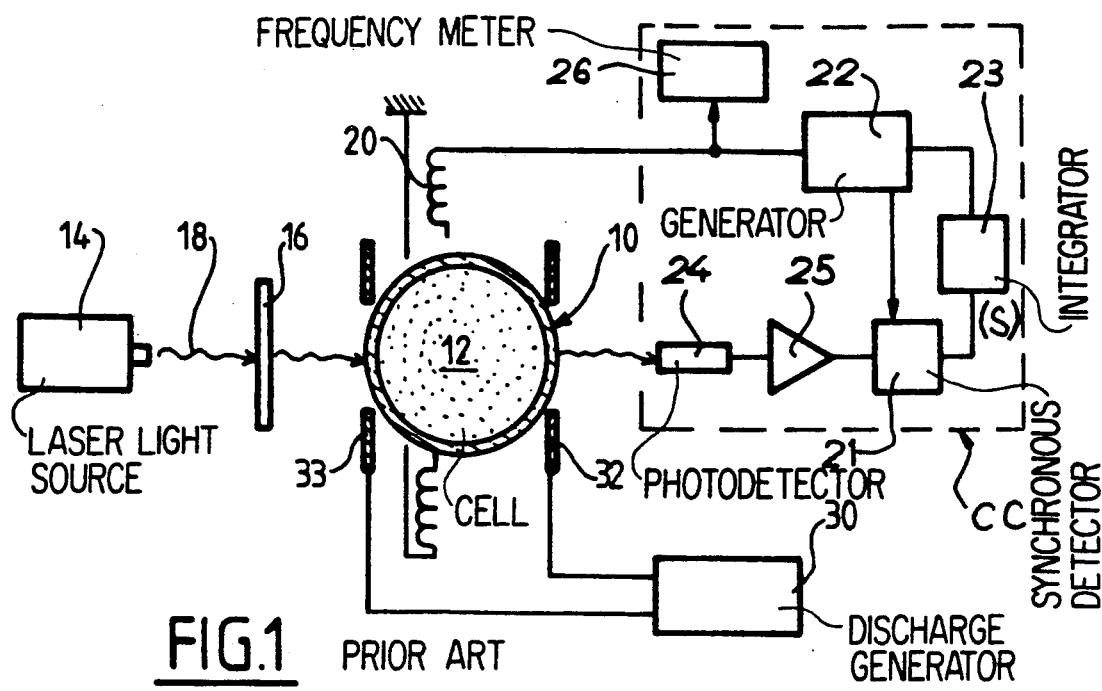
FIG. 1 already described, a resonance and optical pumping magnetometer according to the prior art.
Figure 2:
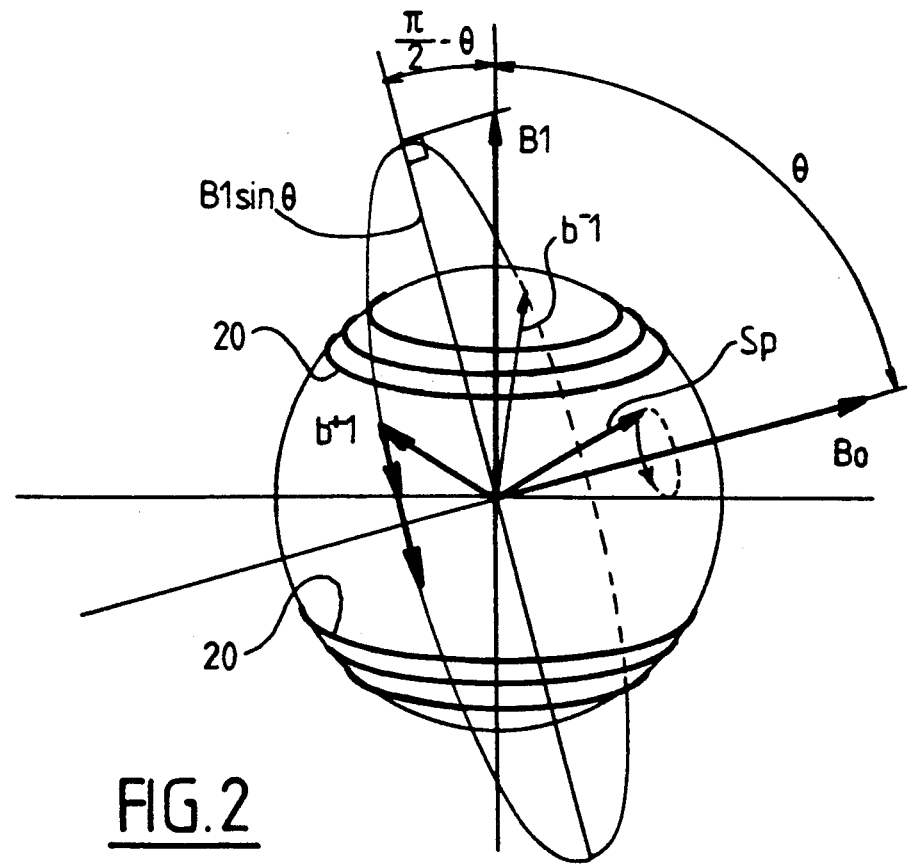
FIG. 2 already described, the relative arrangement of the various magnetic fields.
Figure 4:
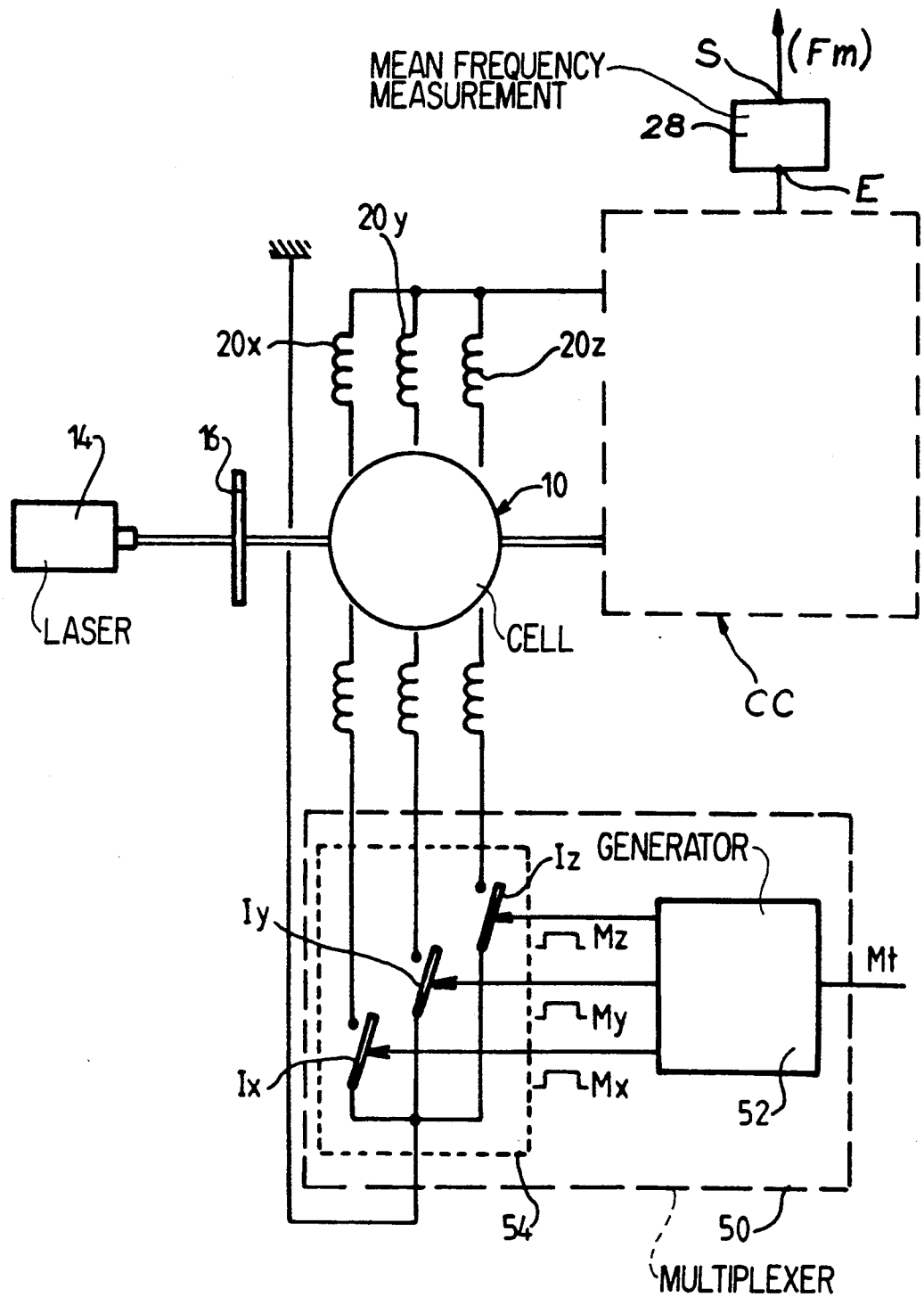
FIG. 4 an optical pumping, resonance magnetometer according to the invention.

A resonance magnetometer according to the invention, in the case of an optical pumping variant, is then in the form shown in FIG. 4. It firstly comprises the known means illustrated by FIG. 1 and which for the same reason carry the same reference numerals. They consist of the helium-filled cell 10, the laser 14, the polarizing means 16 and the circuit CC (incorporating the high frequency generator 22, the photodetector 24, the amplifier 25, the synchronous detection means 21 and the integrator 23) and the discharge generator 30. In accordance with the invention, it also comprises three windings 20x, 20y and 20z arranged in the manner of a trirectangular trihedron around the cell 10 (the representation of FIG. 4 being diagrammatically in this respect, but it is clear that the real arrangement is like that of FIG. 3).

These three windings are switched on by a multiplexer 50, which diagrammatically comprises a generator 52 of three multiplexing pulse trains respectively Mx, My and Mz (and optionally a fourth train Mc, whose function will become apparent hereinafter) and three switches Ix, Iy and Iz able to put into operation each of the windings, i.e. connect them to the exciting circuit 22.

Figure 5A:
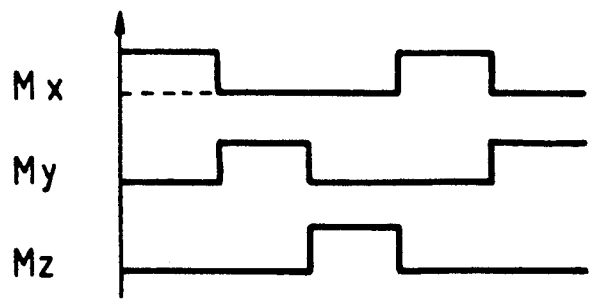
FIG. 5 a timing diagram showing different quantities in a magnetometer according to the invention.
Figure 5B:
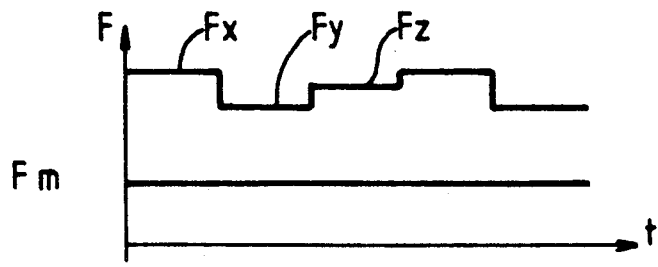
Figure 5C:
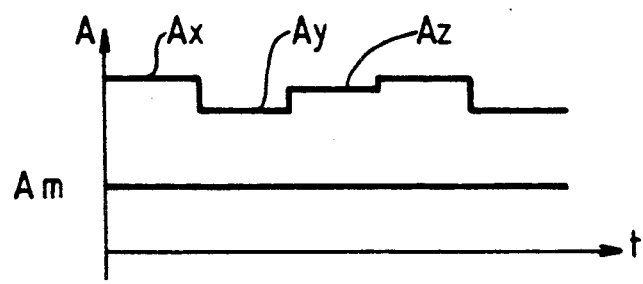

The timing diagrams of FIG. 5 explain the operation of this apparatus. Part (a) shows three multiplexing pulse trains Mx, My and Mz emitted by the generator 52. The pulse times defined switching on or scanning intervals of the windings.

The frequencies of the resonance signals relative to these windings are shown in part (b). As explained hereinbefore, these frequencies suffer from an error, which is dependent on the orientation of the winding axis with respect to the field to be measured. Thus, in general, these three frequencies Fx, Fy and Fz differ. The mean frequency Fm is also shown. It is pointed that, according to the invention, it is not dependent on the orientation of the field.

Part (c) shows the free amplitudes Ax, Ay and Az, corresponding to the three resonance signals and the mean amplitude Am. Bearing in mind the arrangement chosen for the windings, at least two of them supply a signal and at least one supplies an amplitude signal equal to or higher than 80% of the maximum signal. The latter is obtained when the winding axis is perpendicular to the field to be measured.

It is stressed that the directions for which the weakest amplitude signal is obtained are also those for which there is a minimum frequency shift.

A number of embodiments of the means 28 for measuring the mean frequency Fm will now be described in conjunction with FIGS. 6 to 11.

Figure 6:
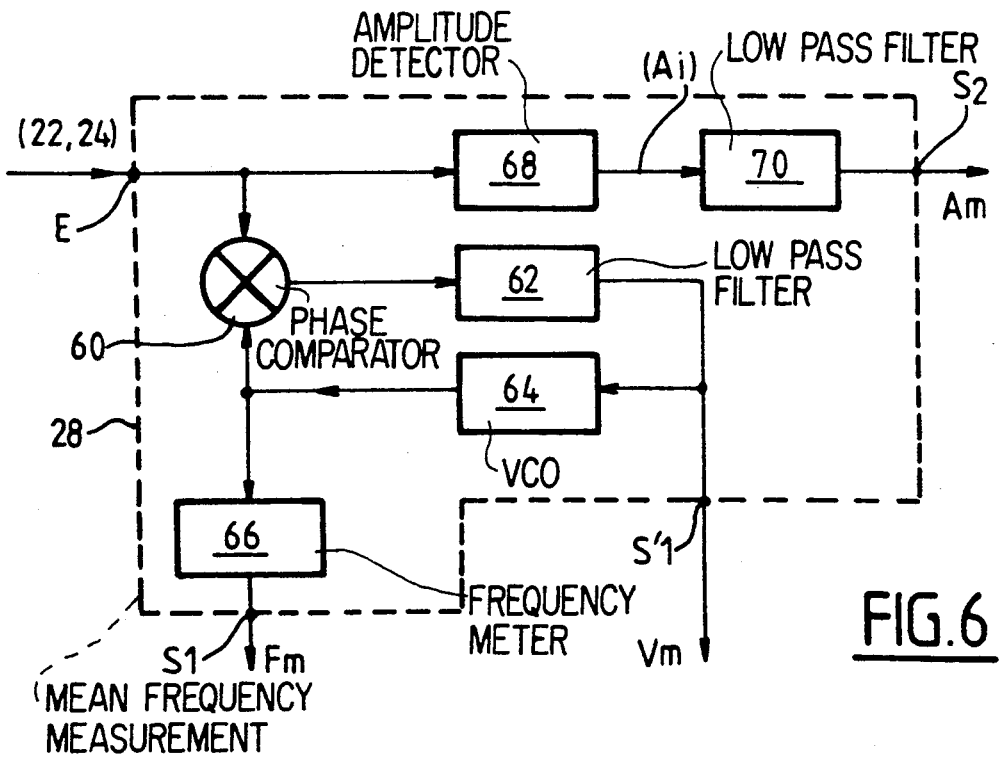
FIG. 6 an embodiment of the means for measuring the mean frequency and the mean amplitude of the resonance signal.

According to FIG. 6, the means 28 for measuring the mean Fm comprise a phase comparison loop with a phase comparator 60, a low-pass filter 62, a voltage-controlled oscillator 64 (or VCO) and a frequency meter 66. The means 28 can also comprise an amplitude detector 68 and a low-pass filter 70, whose cut-off frequency is well below the mean frequency Fm.

The operation of the circuit 28 is as follows. It receives on input E, the resonance signal, which is modulated both as regards frequency and amplitude to the multiplexing frequency, which can be approximately 1 kHz. A first output S1 supplies the sought frequency Fm and an auxiliary output S'1 supplies a voltage (that which is applied to the voltage-controlled oscillator 64) reflecting the said frequency. The circuit 28 also comprises a second output S2 supplying the mean amplitude Am.

Figure 7:
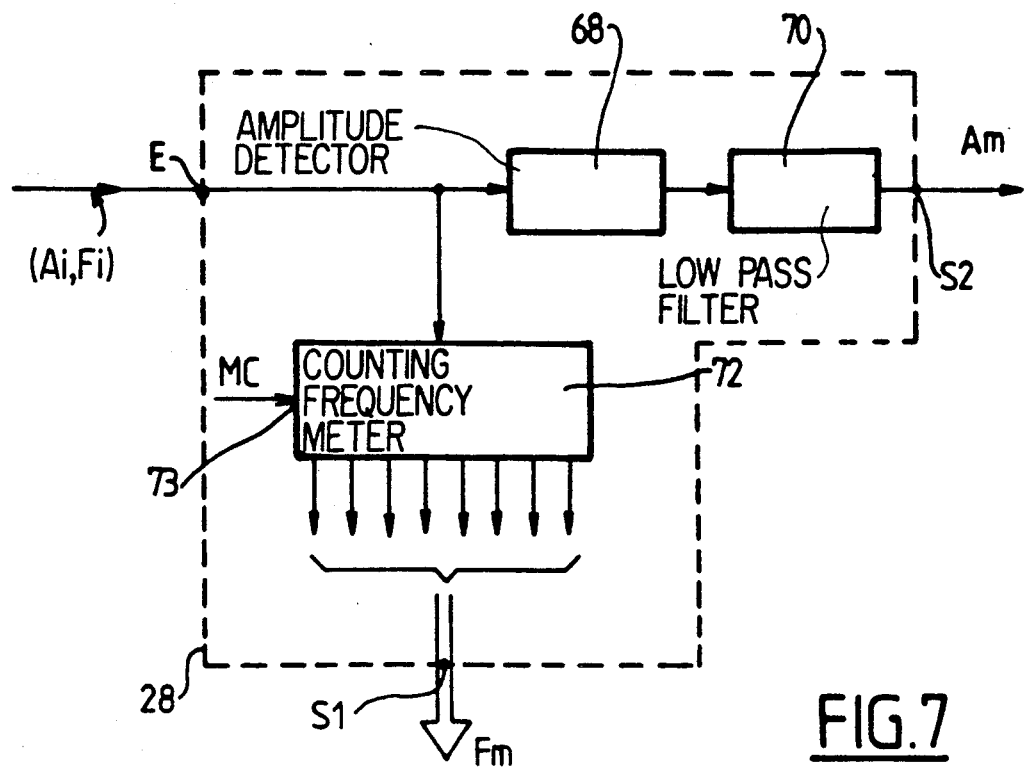
FIG. 7 another embodiment of the measuring means for the mean frequency and the mean amplitude of the resonance signal.

According to another variant illustrated by FIG. 7, the means 28 comprises a counting frequency meter 72 having a control input 73 connected to the generator 52 of the multiplexer 50 and receiving from the latter a counting signal Mc of duration well above the period of the recurrent switching on pulses.

Figure 8:
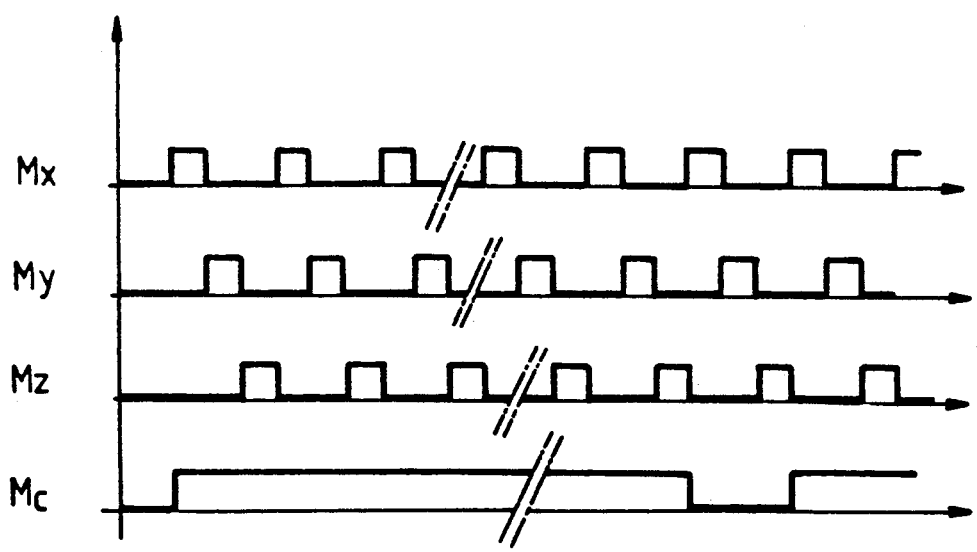
FIG. 8 a timing diagram corresponding to the embodiment of FIG. 7.

The timing diagram of FIG. 8 explains the operation of this circuit. The first three lines show the three multiplexing pulse trains Mx, My and Mz controlling the switching on of the free windings and consequently the appearance intervals of a resonance signal on the input E. The fourth line shows a control signal Mc, whose duration greatly exceeds that of the pulses Mx, My and Mz. For example, the latter will last 1 ms and Mc 999 ms.

The frequency meter 72 counts all the zero passages of the signal during the time of Mc. The number of pulses is the same for Mx, My or Mz (in the example taken 999). The number of passages counted consequently reflect the mean frequency Fm, which is obtained on the output S1.

As for FIG. 6, the processing of the mean amplitude is carried out by an amplitude detector 68 and a low-pass filter 70, the value of Am appearing on an output S2.

According to a more detailed variant, the means 28 for measuring the mean frequency Fm also measure the values of each of the three frequencies Fx, Fy and Fz.

Figure 9:
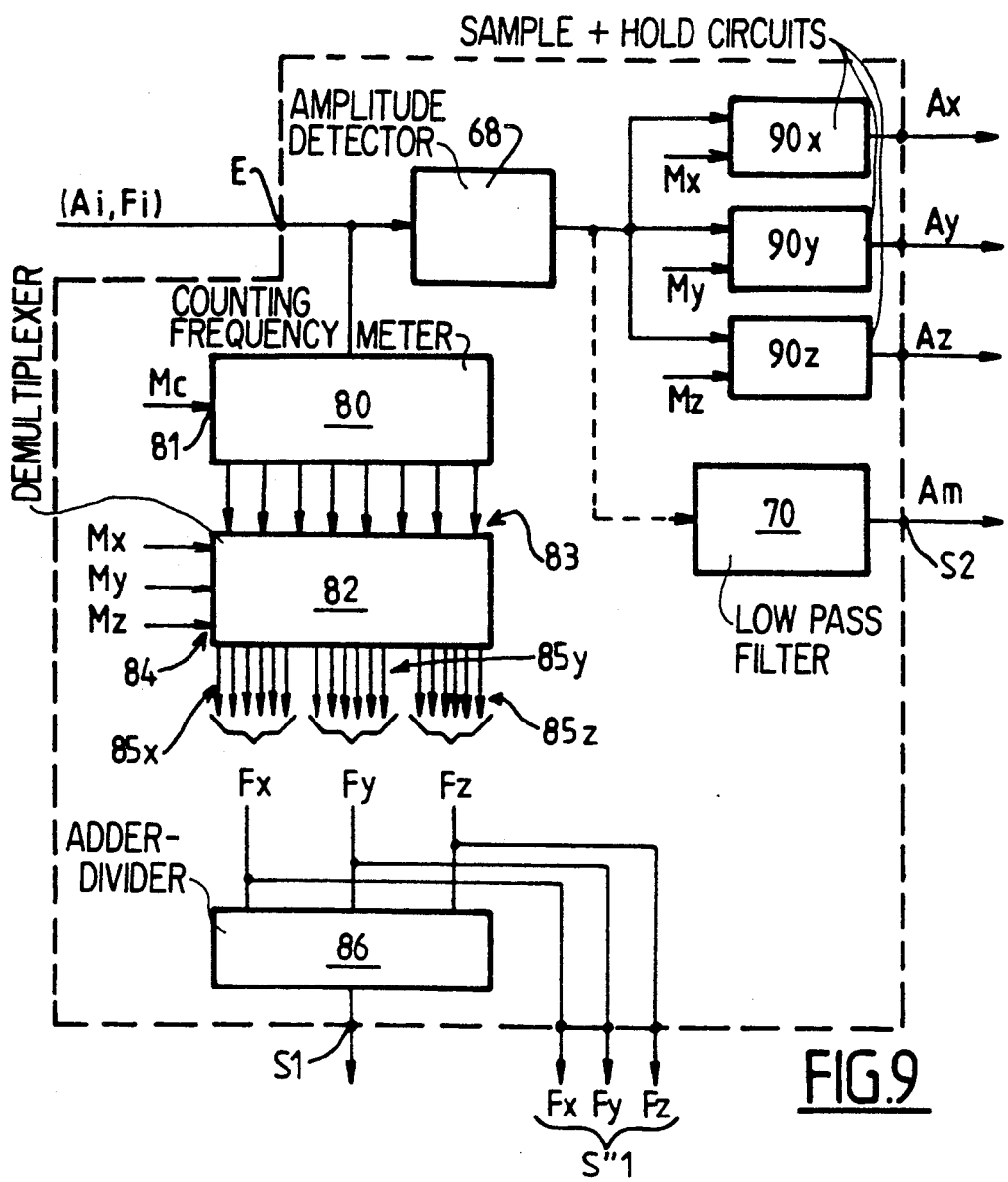
FIG. 9 an embodiment of the means for measuring three resonance signal frequencies, the mean frequency, three amplitudes and the mean amplitude.

According to a first development of this variant illustrated in FIG. 9, the means comprise:
- a counting frequency meter 80 having a control input 81 connected to the generator 52 of the multiplexer 50 from where it receives a count control pulse Mc,
- a demultiplexer 82 having a digital input 83 connected to the counting frequency meter 80, three control inputs 84 connected to the generator 52 of the multiplexer 50 and respectively receiving the control pulses Mx, My and Mz for the three windings, three digital outputs 85x, 85y and 85z connected to three general outputs S"1 supplying the three frequency Fx, Fy, Fz,
- a digital adder-divider having three inputs connected to the three digital outputs of the demultiplexer and an output connected to the general output S1 supplying the mean Fm of the three frequencies.

Figure 10:
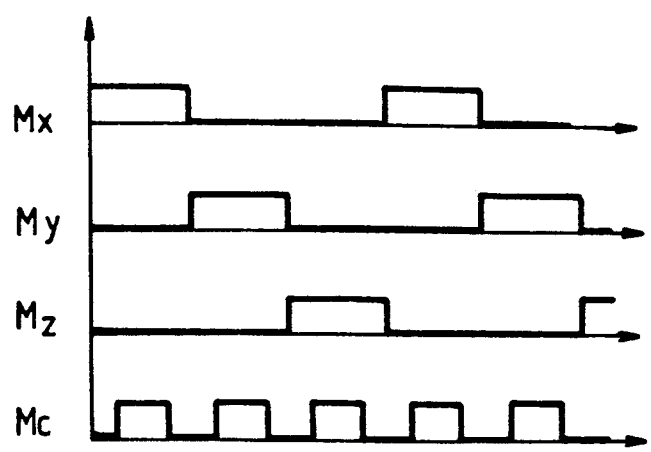
FIG. 10 a timing diagram corresponding to the embodiment of FIG. 9.

The timing diagram of FIG. 10 explains the operation of this circuit. On the three first lines appear the three multiplexing signals Mx, My, Mz for the putting into operation of the windings. On the fourth line is shown in the control signal Mc for the frequency meter 80. The duration of said signal is less than that of the multiplexing pulse Mx, My and Mz. It can e.g. be a time of 1 s compared with 2 s for multiplexing.

The information supplied by the frequency meter 80 consequently relates to Fx, Fy and Fz. Said digital information is distributed over three digital channels by the demultiplexer 82, which is controlled by the multiplexing pulses Mx, My and Mz. Thus, on the digital outputs 85x, 85y, 85z are obtained the values of Fx, Fy and Fz. These outputs are connected to the general output S"1. The general output S1 continues to supply the value of the mean frequency Fm supplied by the adder-divider 86.

In the circuit of FIG. 9, the amplitude processing channel comprises in addition to the amplitude detector 68 and the low-pass filter 70, three sample and hold circuits 90x, 90y and 90z respectively controlled by the three multiplexing signals Mx, My and Mz. The chain 68, 70 supplies the mean value Am of the amplitude on the general output S2 and the sample and hold circuits supply the values Ax, Ay and Az of the three resonance signals.

Figure 11:
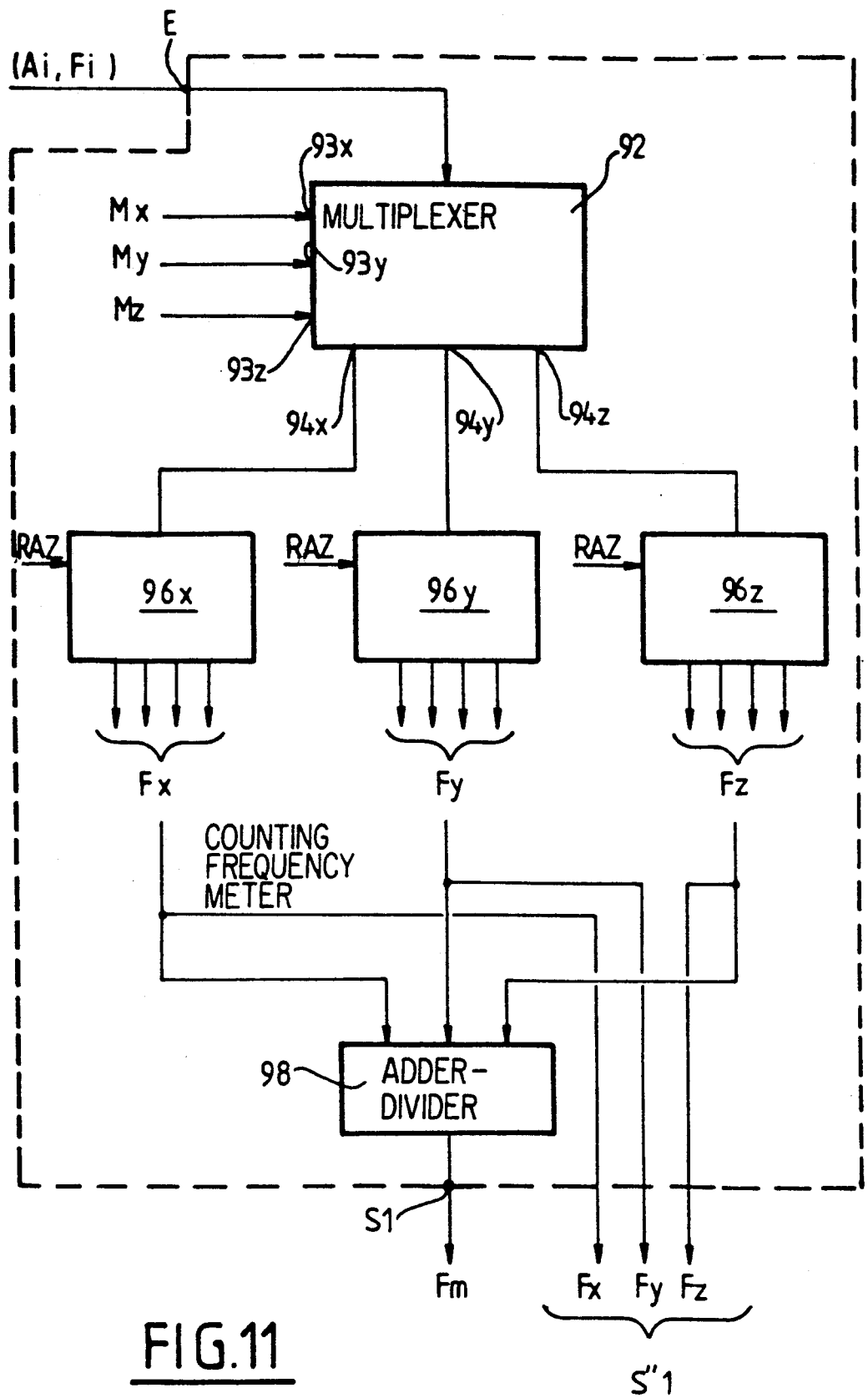
FIG. 11 another embodiment of the measuring means of the three frequencies and their means.

According to another embodiment illustrated in FIG. 11, the means for measuring each of the three frequencies and the mean value of these frequencies comprise:

- a demultiplexer 92 having an input receiving the measuring signal, three control inputs 93x, 93y and 93z connected to the generator 52 of the multiplexer 50 and receiving the three switching on pulses Mx, My and Mz for the said windings and three outputs 94x, 94y and 94z respectively supplying three measuring signals,
- three counting frequency meters 96x, 96y and 96z respectively connected to the three outputs 94x, 94y and 94z of the demultiplexer 92 and respectively supplying the three frequencies Fx, Fy and Fz on an output S"1.
- a digital adder-divider 98 connected to the three frequency meters 96x, 96y and 96z and supplying the mean value of the frequencies Fm on a general output S1.

We claim:

1. A magnetic resonance magnetometer including a cell filled with substance having a gyromagnetic ratio $\gamma$ and subjected to an ambient magnetic field producing a magnetic resonance phenomenon at a frequency $F = \gamma B_o$, said magnetometer also including an exciting means for producing said resonance which includes a winding wound around said cell and a means for exciting said winding by a resonance signal and a means for measuring the frequency of said resonance signal, wherein said exciting winding includes three separate windings having axes forming a trirectangular trihedron, said magnetometer also comprising a multiplexer for sequentially connecting each of said three separate windings to said means for exciting and said magnetometer including a means for measuring the means value $F_m$ of three separate frequencies of three separate resonance signals corresponding to said three windings wherein the value of the ambient magnetic field $B_o$ is determined by $B_o = F_m/\gamma$.

2. The magnetometer according to claim 1 wherein said multiplexer comprises a generator supplying three recurrent pulse trains for respectively switching said three windings and wherein said three recurrent pulse trains occupy separate time intervals.

3. The magnetometer according to claim 1 wherein said means for measuring the mean value includes a phase comparison loop with a phase comparator, a low-pass filter, a voltage-controlled oscillator and a frequency meter.

4. The magnetometer according to claim 2 wherein said means for measuring the mean frequency includes a counting frequency meter having a control input connected to said generator of said multiplexer and wherein said means for measuring receives a counting signal from said generator wherein said counting signal has a duration significantly greater than the duration of the said recurrent pulses of said pulse train.

5. The magnetometer according to claim 2 wherein said means for measuring the mean frequency of said three frequencies also includes a means for measuring the value of each of said three frequencies.

6. The magnetometer according to claim 5 wherein said means for measuring each of said three frequencies and for measuring said mean value of said three frequencies comprises:

- a counting frequency meter having a control input connected to said generator of said multiplexer wherein said generator provides to said meter a counting control pulse occurring during said three recurrent pulse train for putting into operation said three winding and said counting control pulse having a duration less than that of said three recurrent pulses;
- a demultiplexer having a digital input connected to said counting frequency meter and three control inputs connected to said generator of said multiplexer for respectively receiving said recurrent control pulses from said generator, said demultiplexer having three digital outputs which are connected to three general outputs supplying said three frequencies;
- a digital adder-divider having three inputs connected to said three digital outputs of a said demultiplexer and an output connected to a general output of said means for measuring the mean value of the three frequencies and wherein said general output supplies said mean value of said three frequencies.

7. The magnetometer according to claim 5 wherein said means for measuring each of said three frequencies and for measuring the mean value of said three frequencies comprises:

- a demultiplexer having an input receiving said measurement signal, three input controls connected to said generator of said multiplexer wherein said demultiplexer receives said three recurrent pulses for putting into operation said three windings and wherein said demultiplexer includes three outputs respectively supplying said three measurement signals;
- three counting frequency meters respectively connected to said three outputs of said demultiplexer and respectively applying said three frequencies on a separate output; and
- a digital adder-divider connected to said three frequency meters and supplying said mean value of the said frequency on a general output.

8. The magnetometer according to claim 1 further comprising a means for measuring the mean value of the three amplitudes of said three resonance signals corresponding to said three windings.

9. The magnetometer according to claim 8 wherein said means for measuring the mean value of said three amplitudes includes an amplitude detector and a low-pass filter.

10. The magnetometer according to claim 9 wherein said means for measuring mean amplitude of said three amplitudes includes a means for separately measuring said three amplitudes.

11. The magnetometer according to claim 10 wherein said means for measuring said three amplitudes is constituted by three sample and hold circuits controlled by control signals emitted by said multiplexer.

12. The magnetometer according to any one of claims 1–11 wherein said magnetometer is an optical pumping type magnetometer and further comprises a light source emitting a light beam and a polarizer and photodetector receiving said beam after it has passed through said cell.

* * * * *